United States Patent [19]
Zuta

[11] Patent Number: 5,182,528
[45] Date of Patent: Jan. 26, 1993

[54] FREQUENCY SYNTHESIZER HAVING MICROCOMPUTER SUPPLYING ANALOG AND DIGITAL CONTROL SIGNALS TO VCO

[75] Inventor: Marc Zuta, Petah Tikva, Israel
[73] Assignee: Ilatron Ltd., Petah-Tikva, Israel
[21] Appl. No.: 795,180
[22] Filed: Nov. 12, 1991
[30] Foreign Application Priority Data
Nov. 14, 1990 [IL] Israel ................................. 096351
[51] Int. Cl.$^5$ ..................... H03L 7/085; H03L 7/099
[52] U.S. Cl. ..................................... 331/1 A; 331/17; 331/25; 331/34; 331/167; 331/179
[58] Field of Search ..................... 331/1 A, 17, 25, 34, 331/167, 179

[56] References Cited
U.S. PATENT DOCUMENTS

| | | | |
|---|---|---|---|
| 4,450,518 | 5/1984 | Klee | 331/1 A X |
| 4,503,401 | 3/1985 | Kyriakos et al. | 331/17 X |
| 4,646,030 | 2/1987 | Hollister | 331/25 X |
| 4,906,944 | 3/1990 | Frerking | 331/1 A |
| 5,053,723 | 10/1991 | Schemmel | 331/14 |

Primary Examiner—Siegfried H. Grimm

[57] ABSTRACT

A frequency synthesizer includes an oscillator which may be coarse-tuned by a first input receiving a digital signal for selecting one of a plurality of frequency ranges, and fine-tuned by a second input receiving an analog signal for selecting the desired frequency within the selected frequency range. The synthesizer further includes a computer storing the oscillator's characteristics in the form of a digital table of the input signals corresponding to a plurality of frequency values, each identified by digital data. The computer receives input data representing the desired oscillator frequency and generates from the stored digital table, a digital signal indicating the frequency range of the desired oscillator frequency, and an analog signal indicating the specific oscillator frequency desired, and applies both signals to the oscillator. A frequency measuring circuit measures the actual output frequency of the oscillator and outputs a signal corresponding thereto. This signal is fed back to the computer for controlling, in response thereto, the digital and analog signals generated by the computer.

14 Claims, 3 Drawing Sheets

FREQUENCY SYNTHESIZER HAVING MICROCOMPUTER SUPPLYING ANALOG AND DIGITAL CONTROL SIGNALS TO VCO

TECHNICAL FIELD

This invention relates to Digital Frequency Synthesizers, and more particularly to such systems which include an oscillator electronically controlled by a digital computer, and using a frequency counter to implement a closed loop.

BACKGROUND OF THE INVENTION

Heretofore, the two principal methods to generate a signal at a precisely controlled frequency were: The direct method using mixers and filters to add different frequencies to achieve the desired frequency, and The indirect method using a Phase Locked Loop (PLL) with frequency dividers.

The direct method results in a complex implementation because of the complicated signal processing—there are many oscillators, mixers and filters. The indirect method's main drawback is the long settling time when switching to a new frequency. This is the time required for the PLL to lock again at the new frequency.

The frequency of oscillators known in the art is controlled by an analog signal, resulting in a phase and frequency noise because of unavoidable noise in the analog control voltage.

SUMMARY OF THE INVENTION

According to the present invention, there is provided a frequency synthesizer, comprising an oscillator for generating a desired output frequency and including coarse-tuning means having a first input for receiving a digital input signal and for selecting one of a plurality of frequency ranges; and fine-tuning means having a second input for receiving an analog input signal and for selecting a desired frequency within a selected frequency range. The frequency synthesizer further includes a computer having a storage device for storing a digital table of the input signals corresponding to a plurality of frequency values, each identified by digital data; an input for receiving input data representing the desired oscillator frequency; and signal generating means for generating, from the stored digital table and the input data, a digital signal indicating the frequency range of the desired oscillator frequency, and an analog signal indicating the specific oscillator frequency desired. The generated digital signal is applied to the first input of the oscillator to coarse-tune the oscillator with respect to the desired frequency, and the generated analog signal is applied to the second input of the oscillator to fine-tune the oscillator with respect to the desired frequency.

According to further features in the preferred embodiment of the invention described below, the frequency synthesizer further includes a frequency measuring circuit for measuring the actual output frequency of the oscillator and for outputting a corresponding signal; and a feedback circuit for feeding back to the computer the output signal from the frequency measuring circuit; the digital and analog signals generated by the computer are then updated accordingly.

The present invention thus provides a Digital Frequency Synthesizer using a smart, computer-controlled closed loop to generate a precisely controlled frequency.

A computer calculates the required control signals to the oscillator so as to bring the oscillator to the desired frequecy. Instead of waiting for the PLL to achieve lock-in, so as to provide the required control signal to the oscillator—the computer can provide the same control signal almost immediately, thus achieving a much faster frequency switching.

The computer calculates the required control signal value using a table of the oscillator's characteristics—words of required control signals to generate each one of a set of specific frequencies. To enable small frequency increments over a wide frequency range, the required precise control signal is computed using an interpolation algorithm, and based on the words in the table.

Precise closed loop control of oscillator's frequency is achieved by using digital means to measure the actual frequency. The computer can then correct unexpected frequency deviations, to compensate for component values drift or other sources of error. This computation too is based on oscillator's characteristics. The closed loop comprises the oscillator, the digital frequency measurement means, and a computer which is connected back to the oscillator, so as to compensate in real time for any frequency error or disturbance, after the initial setting.

Fast and precise frequency measurement can be achieved by using digital counters connected to the oscillator and to a reference signal, and counting simultaneously. The measurement can be carried on over a variable length of time, as necessary. The measurement time can be increased so as to achieve any desired precision.

Lower oscillator noise is achieved by using digital control signals to connect or disconnect components in the circuit which determines the frequency, so as to set the oscillator at one of a plurality of frequency ranges; the oscillator can then be made less sensitive to the analog control voltage, because the analog voltage is needed only to fine-tune the frequency, thus achieving lower phase noise.

According to another aspect of the invention, there is provided a method of controlling an oscillator for generating an output signal having a desired frequency, comprising:

storing in a storage device a digital table of the input signals corresponding to a plurality of frequency values, each identified by digital data;

coarse-tuning the oscillator by selecting, from the stored digital table, the frequency range which includes the desired frequency to be generated by the oscillator; and fine-tuning the oscillator to the specific desired frequency within the selected frequency range.

According to still further features in the described preferred embodiment, the fine-tuning of the oscillator is effected by generating an analog signal by interpolation corresponding to the desired frequency within the selected frequency range, and applying the analog signal to the oscillator. In addition, the output frequency of the oscillator is measured and is utilized for tuning the oscillator.

Further objects, advantages and other features of the present invention will become obvious to those skilled in the art upon reading the disclosure set forth hereinafter. The following description and drawings detail the structure and operation of the Digital Frequency Synthesizer, and a method to synthesize a precise frequency.

DETAILED DESCRIPTION OF THE INVENTION

A preferred embodiment of the present invention will now be described by way of example and with reference to the accompanying drawings.

Figure 1:
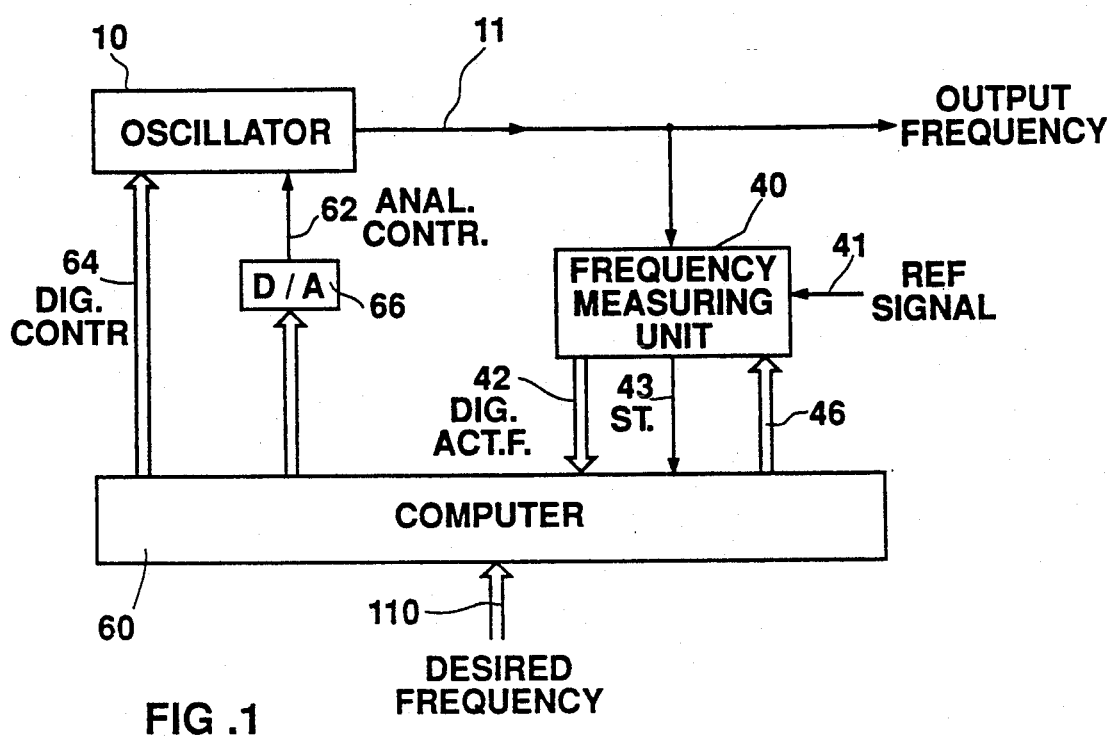
FIG. 1 is a description of the overall structure of the Digital Frequency Synthesizer.

Referring to FIG. 1, the example of the overall structure of the Digital Frequency Synthesize, the oscillator 10 generates an output signal 11 at a frequency which is determined by analog control signal 62 and digital control signals 64 applied to its input.

Unit 40 is connected to oscillator's output 11 to measure digitally the oscillator's 10 frequency. Measuring unit 40 generates digital words indicative of oscillator's 10 frequency, digital words which are transferred through channel 42 to the computer means 60.

Unit 40 uses a reference signal 41 to facilitate the measurement, as detailed hereinafter. The computer means 60 is best implemented using a microcomputer or microcontroller including arithmetic and storage means, as is known in the art. Unit 60 comprises the following components (not shown):

RAM or ROM devices for storing a table of said oscillator's characteristics—there are a plurality of entries in the table, each entry defining the required control signals to cause a specific frequency at the oscillator's 10 output. The entries describe the digital control signals 64 and the analog control signals 62 to be applied to the oscillator 10.

ROM storage is used to keep a fixed table describing the oscillator 10. RAM storage can be used to update the table according to most recent measurements, thus taking into account aging of components, temperature and other variables.

A Central Processing Unit for computing the required control signals according to the desired frequency received via channel 110, according to oscillator's table and according to the digital words 42 indicative of the oscillator's frequency.

The CPU is connected, through interface devices and channel 42, to the unit 40 which measures the oscillator's frequency. The implementation of an arithmetic unit in software using the CPU or in hardware is well known in the art.

The digital control signals are written to memory registers (Latch devices), which keep the computed values and generate the logical signals sent as the digital control signals 64 to the oscillator 10.

The values for the analog control signals are written to Latch devices and are transferred to Digital to Analog Converter 66, which generates the analog control signal 62 sent to the oscillator 10. Unit 60 controls continuously, in real time, the measuring process using control signals 46, and checks the unit 40's status on the status line 43.

Figure 2:
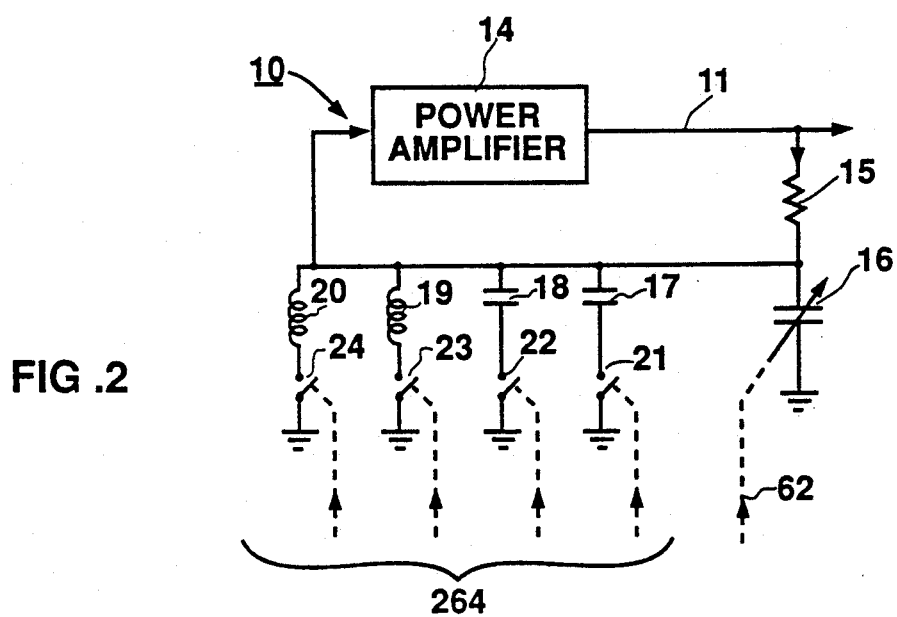
FIG. 2 details the structure of the Electronically Controlled Oscillator.

FIG. 2 details one possible structure and operation of the oscillator 10, which comprises the power amplifier 14 and the feedback circuit.

The feedback circuit comprises a voltage dividing circuit with resistor 15 in series with an inductor-capacitor resonance circuit, where the values of the parts in the resonance circuit determine oscillator's 10 frequency—this is the frequency of signal 11 at amplifiers's 14 output.

The inductance comprises inductor 19 or inductor 20 or both inductors in parallel, as defined by the state of solid state switches 23 and 24 respectively. Only inductors whose switches are conducting (in the ON state) participate in the resonant circuit, all others are disconnected.

The capacitance comprises capacitor 16 in parallel with capacitor 17 or capacitor 18 or both or none, as defined by the state of the electronically controlled switches 21 and 22 respectively.

The switches 21, 22, 23, 24 are controlled on/off by the digital control signals 64 received from the arithmetic and storage unit 60. In the configuration described in FIG. 2, there are 15 possible discrete values of frequency—there are 4 control lines, but one inductor must remain connected.

More inductors and/or capacitors may be connected (not shown), so as to result in much more frequencies defined by the digital control signals 64.

Other implementations may be used to switch elements in the oscillator's frequency determining circuit—for example, switching stub elements (not shown) in a microwave oscillator.

Figure 3:
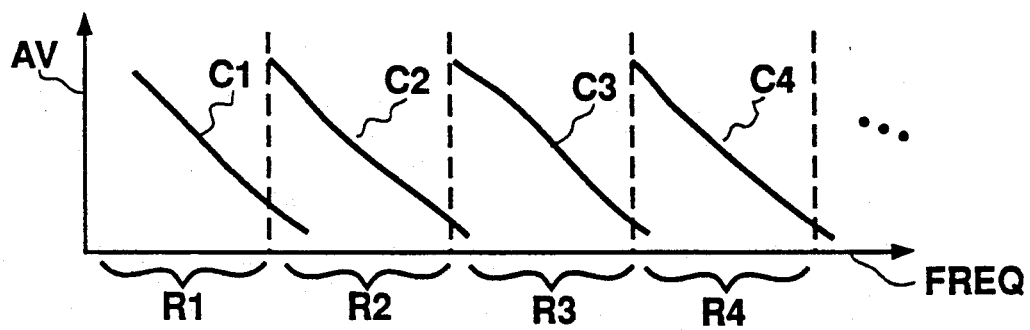
FIG. 3 illustrates the electrical characteristics of the Electronically Controlled Oscillator.

The varactor 16 changes its capacitance according to the analog control signal 62, thus enabling a fine, continuous frequency adjustment. FIG. 3 illustrates the resulting electrical characteristics of the Electronically Controlled Oscillator 10. It is a graph of the required analog control voltage AV as a function of oscillator's frequency FREQ.

Frequency ranges R1, R2, R3, R4 pertain to different values of the digital control signal 64—C1, C2, C3, C4.

These are oscillator's characteristics, defining the required control signals to cause the oscillator to generate any frequency.

In each frequency range, the graph is continuous; therefore it can be described by a finite set of values, stored in digital form. These are the entries in the table in the Arithmetic Unit of the computer 60, describing oscillator's 10 characteristics.

Another implementation which provides several frequency bands (not shown) uses several oscillators and a switching unit to select the output of one oscillator to be transferred to the system's output. The digital control signals determine which oscillator is connected to the output.

Figure 4:
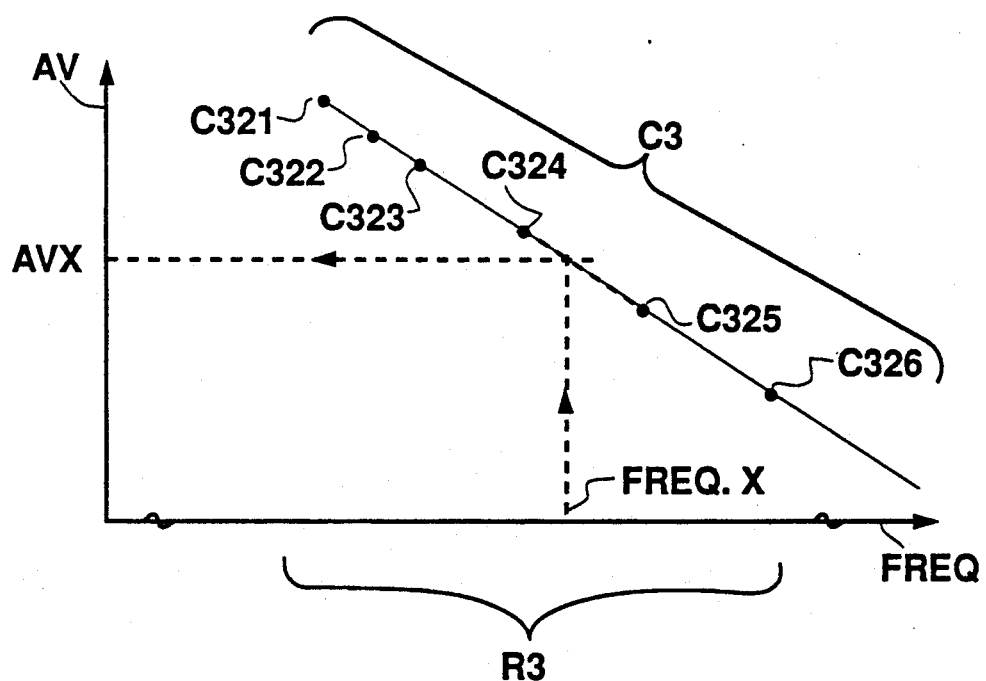
FIG. 4 details points which are entries in the table of Electronically Controlled Oscillator's electrical characteristics.

FIG. 4 details points which are entries in the table of oscillator 10's electrical characteristics, illustrated as a detail of curve C3, frequency range R3 of FIG. 3.

Each point C321, C322, C323 etc defines the relationship between one frequency and the corresponding control signals. The digital control signal 64 has a constant value for all the points of curve C3.

The analog control signal AV is represented by a digital word. The curve is very close to linear between those points, therefore the precise control signal to the oscillator can be computed using the linear interpolation method, using two points.

For example, the required analog control signal AVX to generate frequency FREQX is computed as a linear interpolation between points C324–C325.

A more complex interpolation method may be used, using more points and polynomial, trigonometric or Hermite interpolation.

Figure 5:
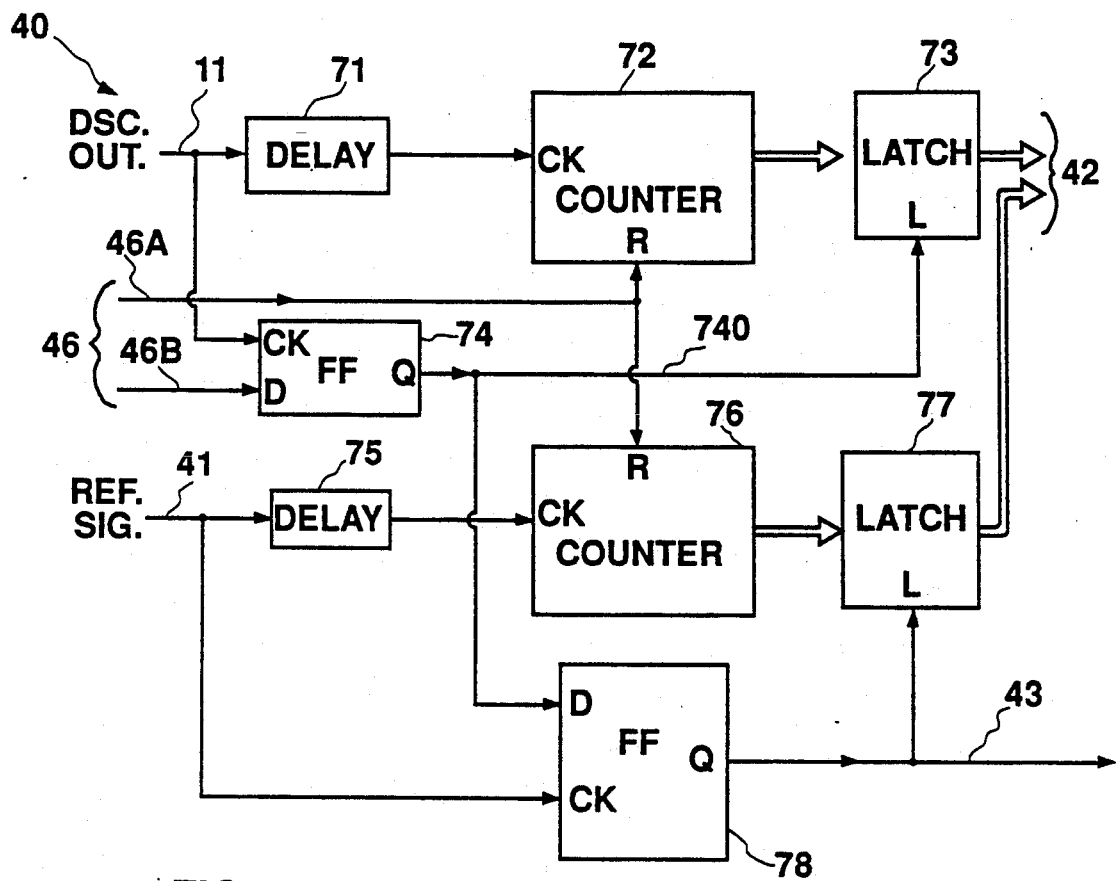
FIG. 5 illustrates one method for measuring oscillator's frequency by counting simultaneously oscillator's pulses and a reference signal's pulses.

FIG. 5 details the structure and operation of one implementation of the unit 40. Unit 60 controls the measuring process using control signals 46, comprising the signals 46A and 46B.

Counter 72 counts oscillator 10's pulses 11. The pulses pass through delay unit 71 to counter's clock input CK.

Counter 76 counts the reference signal 41's pulses. The pulses pass through delay unit 75 to counter's clock input CK. Both counters 72, 76 are reset by control signal 46A, connected to their reset input R. Both counters start simultaneously counting when unit 60 ends the reset signal.

Figure 6:
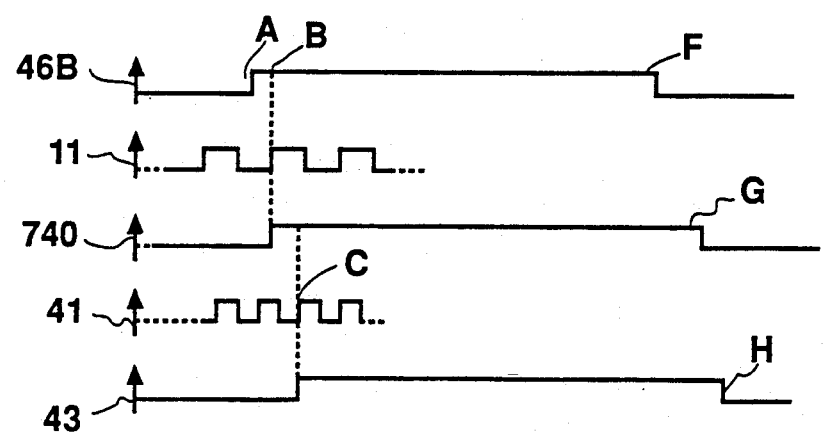
FIG. 6 details the essential signals during the measuring process.

Unit 60 can read counter's values without stopping them by rising control signal 46B to High at time A—see also FIG. 6. D-flip flop 74 then receives a High at its D input. The next rise of signal 11 at time B rises flip flop 74's clock CK input. Flip flop 74's Q output rises to High. This is signal 740, connected to Load input L of latch 73.

For microwave frequencies, the counter can count a signal derived from the generated signal, not the generated signal itself.

The measured signal can be derived by downconversion (not shown)—mixing with a known reference signal and low pass filtering.

Several counters (not shown) can be used to count simultaneously several signals derived from the generated signal by mixing with several reference signals and low pass filtering.

The computer can solve the ambiguity and calculate the frequency of the generated signal using algorithms known in the art.

An alternative to reading the reference counter 76 value is to enable counter 72 to count for fixed periods of time of predetermined value (not shown). The frequency can be determined from counter's value and the known time period.

The rising edge of signal 740 loads counter 72's value to latch 73. The delay 71 is needed so that counter 72's output changes after the current value is read to unit 73, to avoid a critical race. Signal 740 is also connected to D—flip flop 78's D input.

The next rise of signal 41 at time C rises flip flop 78's clock CK input. Flip flop 78's Q output rises to High. This is signal 43, connected to Load input L of latch 77.

The rising edge of signal 43 loads counter 76's value to latch 77. The delay 75 is needed so that counter 76's output changes after the current value is read to unit 77, to avoid a critical race.

Therefore the latches 73, 77 hold values of the counters 72, 76 respectively which are read almost at the same time, the difference being smaller than one cycle of reference signal 41.

Furthermore, the counter 76's value corresponds to a time which is an integer multiple of signal 11's period time, and the number of signal 11's periods is contained by latch 73.

Therefore signal 11's frequency can be computed from the ratio of the values in latches 73, 77 and the known frequency of signal 41. Alternatively, the latches 73, 77 can be loaded simultaneously, paying attention not to cause a critical race.

Signal 43 is also connected to unit 60, and its High state indicates that both latches 73, 77 are loaded with counter's values. Unit 60 can then read latches' values using channel 42. Unit 60 then lowers signal 46B at time F. After some time signals 740 and 43 go to Low state, at time G, H respectively. The unit is ready for another counters reading.

During this process, the counters 72, 76 continue counting. This enables to improve the frequency measurement precision to any desired value.

Unit 60 uses the ratio between counter's values to compute oscillator 10's frequency.

If an error in the frequency of signal 11 relative to the desired frequency is detected, then new control signals 62, 64 are computed and applied to oscillator 10; Counters 72, 76 are reset using signal 46A, and a new measuring cycle begins.

If no error is detected, the counters 72, 76 are allowed to continue counting, thus increasing the measurement's precision, because the measurement is cumulative, integrating pulses over longer periods to achieve any desired precision.

The counters' 72, 76 finite length is no limitation to the achievable precision, because Unit 60 can take their overflow into account, adding High Order Bits to counters' values according to overflow and computing the frequency using the whole correct counter's values.

It will be recognized that the foregoing is but one example of an apparatus and method within the scope of the present invention and that various modifications will occur to those skilled in the art upon reading the disclosure set forth hereinbefore.

What is claimed is:

1. A frequency synthesizer, comprising:
  (A) an oscillator for generating a desired output frequency and including:
    (1) coarse-tuning means having a first input for receiving a digital input signal and for selecting one of a plurality of frequency ranges; and
    (2) fine-tuning means having a second input for receiving an analog input signal and for applying said signal to a variable reactance component in a resonating circuit, for selecting a desired frequency within a selected frequency range;
  (B) a computer, including:
    (1) a storage device for storing said oscillator's characteristics in the form of a digital table of the input signals corresponding to a plurality of frequency values, each identified by digital data;
    (2) an input for receiving input data representing the desired oscillator frequency; and
    (3) signal generating means for generating, from said stored digital table and said input data, a digital signal indicating the frequency range of said desired oscillator frequency, and an analog signal indicating the specific oscillator frequency desired;
  (C) an electrical circuit for applying said generated digital signal to said first input of the oscillator to coarse-tune the oscillator with respect to the desired frequency, and said generated analog signal to said second input of the oscillator to fine-tune the oscillator with respect to the desired frequency;

(D) a frequency measuring circuit for digitally measuring the actual output frequency of the oscillator and for outputting a signal corresponding thereto; and (E) a feedback circuit for feeding back to said computer the output signal from said frequency measuring circuit and for controlling, in response thereto, the digital and analog signals generated by said computer.

2. The frequency synthesizer according to claim 1, wherein said frequency measuring circuit (D) outputs said signal while continuing to measure, and said computer (B) monitors said signal and outputs said digital and analog signals to said oscillator and restarts said measuring circuit (D) when a deviation of the actual frequency from the desired frequency is detected.

3. The frequency synthesizer according to claim 1, wherein said frequency measuring circuit (D) includes ratio-measuring means for measuring the ratio between the actual output frequency of the oscillator and a reference frequency.

4. The frequency synthesizer according to claim 3, wherein said frequency measuring circuit (D) includes:
  (1) a first counter for counting cycles of the actual output frequency of the oscillator;
  (2) a second counter for counting cycles of the reference frequency;
  (3) means for enabling both counters at the same time;
  (4) means for reading said counters at the same time; for storing in a memory the count of each of said counters; and for outputting digital words corresponding thereto.

5. The frequency synthesizer according to claim 4, wherein said computer monitors the deviation of the count in the first counter with respect to the count in the second counter and outputs said digital and analog signals to said oscillator and restarts said measuring circuit (D) when a deviation of the actual frequency from the desired frequency is detected.

6. The frequency synthesizer according to claim 2, wherein said frequency measuring circuit (D) further includes means for downconverting said oscillator's output frequency prior to frequency measurement.

7. The frequency synthesizer according to claim 2, including a plurality of frequency measuring circuits (D), each connected to one of a plurality of means for downconverting said oscillator's output frequency, wherein each of said downconverting means converts said oscillator's frequency to a different value; and wherein all said downconverters are connected to said oscillator's output and said frequency measuring circuits measure during the same time period.

8. The frequency synthesizer according to claim 1, wherein said computer further includes writable storage means for storing updated values of said oscillator's characteristics in the form of a digital table of the input signals corresponding to a plurality of frequency values, each identified by digital data, wherein said digital data correspond to frequency values read from said frequency measuring circuit.

9. The frequency synthesizer according to claim 1, wherein said coarse-tuning means (A) (1) comprises a plurality of resonant circuit components which determine the resonating frequency and are selectively enabled by the digital input signal applied to said first input.

10. The frequency synthesizer according to claim 1, wherein said coarse-tuning means (A) (1) comprises a plurality of oscillators each operating in a frequency range; and selector means for connecting one of said oscillators to the oscillator's output, according to the digital input signal applied to said first input.

11. A method of controlling an oscillator for generating an output signal having a desired frequency, comprising:
  (A) storing in a storage device an oscillator's characteristics in the form of a digital table of the input signals corresponding to a plurality of frequency values, each identified by digital data;
  (B) receiving the value of a desired frequency;
  (C) computing the values of a coarse-tuning signal and a fine-tuning signal for said oscillator, according to said digital table and said desired signal; and
  (D) applying said coarse tuning signal to said oscillator to select one of a plurality of frequency ranges; and applying said fine-tuning signal to said oscillator to select a desired frequency within a selected frequency range.

12. The method according to claim 11, wherein said fine-tuning of the oscillator is effected by generating an analog signal by interpolation corresponding to the desired frequency within the selected frequency range, and applying said analog signal to the oscillator.

13. The method according to claim 11, wherein the output frequency of the oscillator is measured and is utilized for tuning the oscillator.

14. The method according to claim 13, wherein said output frequency is continuously monitored and compared to said desired frequency; and when an error is detected, the output frequency of the oscillator is corrected.

* * * * *